United States Patent
Lee et al.

(10) Patent No.: US 9,735,049 B2
(45) Date of Patent: Aug. 15, 2017

(54) METHOD FOR FABRICATING SEMICONDUCTOR STRUCTURE WITH PASSIVATION SIDEWALL BLOCK

(71) Applicant: TAIWAN SEMICONDUCTOR MANUFACTURING CO., LTD., Hsinchu (TW)

(72) Inventors: Chih-Ming Lee, Tainan (TW); Hung-Che Liao, Tainan (TW); Kun-Tsang Chuang, Miaoli County (TW); Wei-Chung Lu, Tainan (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 14/952,434

(22) Filed: Nov. 25, 2015

(65) Prior Publication Data

US 2017/0148667 A1    May 25, 2017

(51) Int. Cl.
*H01L 21/31*    (2006.01)
*H01L 21/768*   (2006.01)
*H01L 23/522*   (2006.01)
*H01L 23/532*   (2006.01)
*H01L 21/02*    (2006.01)

(52) U.S. Cl.
CPC .. *H01L 21/76837* (2013.01); *H01L 21/76843* (2013.01); *H01L 21/76879* (2013.01); *H01L 23/5226* (2013.01); *H01L 23/5329* (2013.01); *H01L 23/53223* (2013.01); *H01L 23/53238* (2013.01); *H01L 21/02129* (2013.01); *H01L 21/02164* (2013.01)

(58) Field of Classification Search
CPC ......... H01L 21/76837; H01L 23/53223; H01L 21/76843; H01L 21/76879; H01L 23/53238; H01L 23/5226; H01L 23/5329; H01L 21/76841; H01L 23/53266; H01L 28/75; H01L 21/02129; H01L 21/31625; H01L 21/31608; H01L 21/02164
See application file for complete search history.

(56) References Cited

U.S. PATENT DOCUMENTS

| 2008/0197502 A1* | 8/2008 | Kikuchi | H01L 21/2885 257/758 |
|---|---|---|---|
| 2009/0224360 A1* | 9/2009 | Kim | H01L 23/5256 257/529 |
| 2010/0019348 A1* | 1/2010 | Nagai | H01L 27/11502 257/532 |
| 2012/0241969 A1* | 9/2012 | Okazaki | H01L 23/528 257/773 |
| 2015/0035156 A1* | 2/2015 | Ichinose | H01L 23/53295 257/758 |

* cited by examiner

*Primary Examiner* — Thanh T Nguyen
(74) *Attorney, Agent, or Firm* — Maschoff Brennan

(57) ABSTRACT

A semiconductor structure and a method for forming the semiconductor structure are provided. The method includes receiving a substrate with two sections of conductors thereon that are adjacent to each other, and a valley between the two sections of the conductors, filling the valley with a first passivation material to form a passivation valley, applying a second passivation material overlying the two sections of conductors and the passivation valley and over the substrate, and removing the second passivation material overlying the two sections of conductors and the passivation valley, and the second passivation material over the substrate but not in contact with the two sections of conductors and the passivation valley.

20 Claims, 11 Drawing Sheets

METHOD FOR FABRICATING SEMICONDUCTOR STRUCTURE WITH PASSIVATION SIDEWALL BLOCK

BACKGROUND

Along with the increasing demand for the miniaturization and also performance in the semiconductor manufacturing, conductors fabricated onto a semiconductor substrate are of higher and higher density, giving rise to narrowing of the space, or the valley, between conductors.

Generally, a passivation material is applied over the conductors and the valleys between conductors. However, the narrowed valley adds difficulty to filling the valley with the passivation material, which usually affects the applying of the subsequent photoresist and thus the process of lithography. The spacing and insulation between the conductors on the semiconductor structure is becoming a pivotal issue in the semiconductor manufacture.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
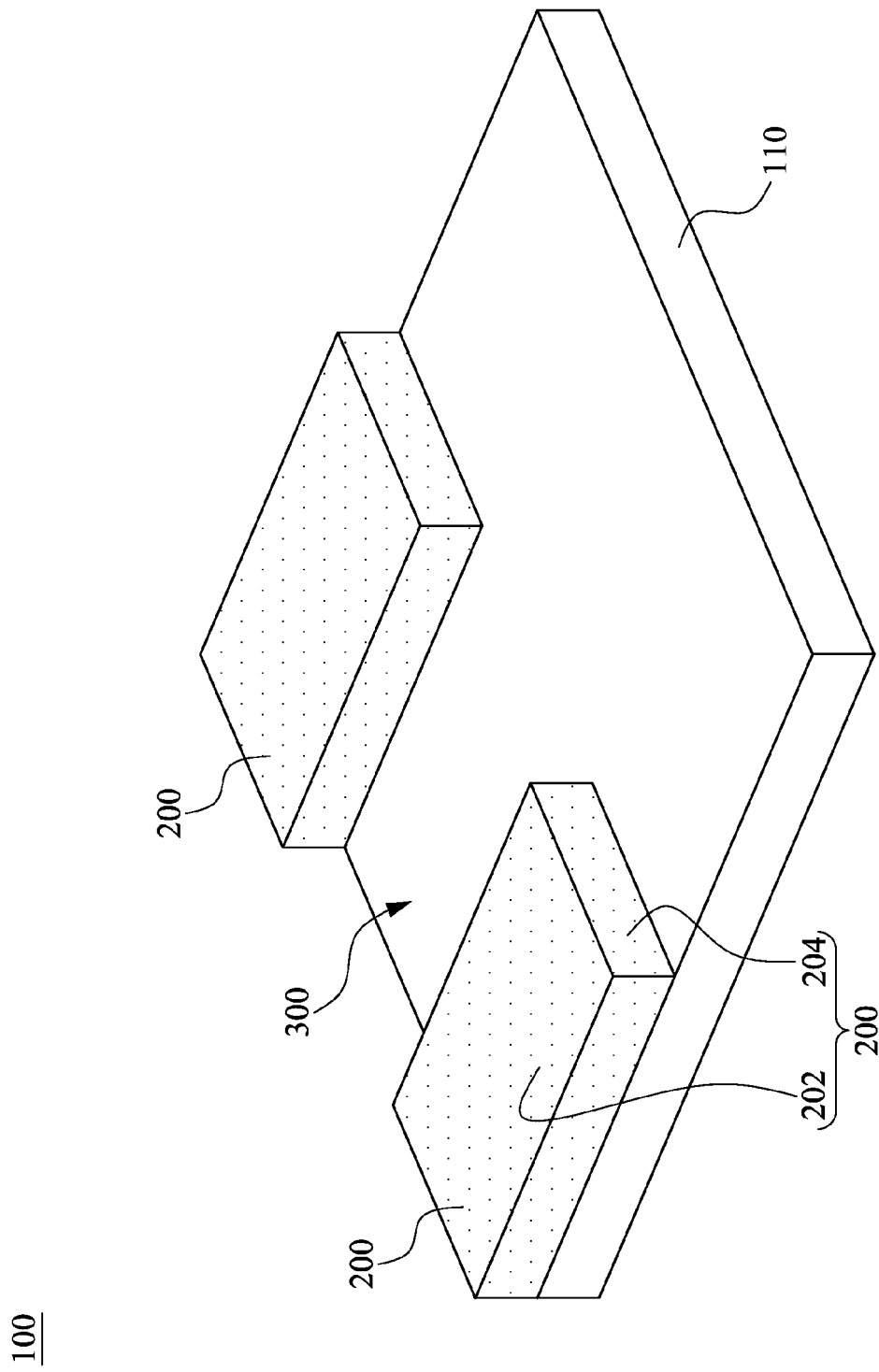
FIG. 1 is a cross-sectional view of a semiconductor structure in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The singular forms "a," "an" and "the" include plural referents unless the context clearly dictates otherwise. Therefore, reference to, for example, a topography region includes aspects having two or more such topography regions, unless the context clearly indicates otherwise. Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Although the present disclosure is explained by references of the formation of a semiconductor structure, it will be appreciated that it is equally applicable to any lithographic manufacturing process where the semiconductor structure can be advantageously formed on a surface of a substrate.

As mentioned above, it is becoming more and more challenging to form an integrated circuit device with the dimensions scaled down and the density of integrated circuits scaled up. With increasing density of integrated circuits, underlying conductors are correspondingly more tightly aligned, rendering the spacing between two sections of conductors narrower.

To finely insulate and protect the conductors, or the conductive wires, a passivation layer with dielectric characteristics is typically covered on the conductive wires and a space, or a valley, between the wires. The coverage of the passivation layer on the conductive wires is yet another issue, with the coverage ratio as poor as 40%.

Moreover, since the passivating particles deposits faster at a corner than on a surface, the passivating particles tends to reside at an upper corner of the valley, narrowing the access through which other passivating particles can get to a bottom of the valley. With more passivating particles at the upper corners and less passivating particles on the bottom, only a top area and an peripheral portion of the valley is gradually deposited with a thin passivation layer, not to mention that the narrowing of spacing makes it even more difficult for a passivation layer to fill the valley. The incomplete filling of the passivation layer in the valley gives rise to cavities or tunnels in the pattern of keyholes and have an opening beside a side of the conductors.

During the subsequent photoresist coating, the photoresist can sink into the tunnels, rendering the layer of photoresist thinner above the valley. On the one hand, the thinning in photoresist yields holes in the passivation layer after etching. On the other, the residual air in the tunnels will inflate as temperature rises. Due to inflation of air within the tunnel, the photoresist within the tunnel is forced out, which oppresses photoresist surrounding the substrate and conductors and causes swelling in the photoresist during a succeeding heating procedure. In other words, the opening of the tunnel in the passivation layer is more subject to photoresist invasion and residual issues in subsequent procedures with thermal changes. Accordingly, it is of huge importance to seal the opening of the cavity in the passivation layer.

To lessen the problem by obstructing the formation of tunnels, patterning conductive wires trapezoidally or forming better planarization before the last layer of wiring can improve the passivation layer coverage and hinder the formation of tunnels, while still suffering from procedure maturity, productivity, and complication.

In order to solve the above-mentioned problems, the present disclosure provides a semiconductor structure and a method for forming the semiconductor structure, which forms a passivation sidewall block over the opening of the tunnel in the passivation material. Therefore, the strain from residual photoresist sinking into the tunnel in the semiconductor structure can be conquered.

With reference to FIG. 1, there is an illustrated cross sectional side view of schematic area arrangement of a semiconductor structure 100. The semiconductor structure 100 is part of a discrete, larger semiconductor device where integrated circuits are formulated upon the surface of the substrate 110. The proposed circuits are created by subsequently fabricating a multi-level, interconnected metallic wiring network on the device.

The multi-layer wiring are formed by way of depositing an insulating layer on the device, patterning and etching openings into the insulating layer, and eventually applying a layer of conductive material over the openings of the insulating layer. The conductors, more specifically referred to as conductive wiring, are deposited by sputtering or vacuum evaporation over the openings of the insulating layer, while the conductive wires 200, also referred to as sections of conductors, form interconnections between contacts of the device, thereby establishing a first level of basic circuitry.

In some embodiments, the first level of basic circuitry may be further interconnected to additional levels of wiring laid out on additional insulating layers with openings. In various embodiments, the conductive wiring can also interconnect small bonding pads in the periphery to the large chip pad in the center of the integrated circuit chip. Thus, the final level of circuitry directs the wiring from peripheral bonding pads on top of the uppermost inter metal dielectric (ILD) layer to the chip pad bonded to external wirings and surrounded by bonding pads.

Relying on the composition of the overall integrated circuit design, in several embodiments, two or more layers of metallurgy and one or two layers of patterned polysilicon are widely employed to form interconnections. Finely designed layout of conductive wiring not only provides advantageous flexibility in the integrated circuit design, but permits more leeway in setting the margins for the metal wiring resistance and current capacity.

In terms of the material of conductor for wiring, aluminum (Al) is known as the mainstream material for its high conductivity and applicability to semiconductor structure fabrication, while copper (Cu) exhibit lower resistance and superior integration in higher-speed or lower-voltage semiconductor devices. Since merely adopting copper (Cu) as the wiring material may exhibit susceptibility to corrosion and environmental attack and elevated manufacturing costs, designs in conductive wiring are confronted with the tradeoff between copper (Cu) and aluminum (Al).

In various embodiments, a design is to lay a layer of aluminum (Al) over the last layer of copper (Cu) wiring, while applying a layer of opening to connect layers of aluminum (Al) and copper (Cu). By means of this, bonds of wires are fabricated directly through the openings to the underlying copper (Cu) wiring.

Besides, in some other embodiments, copper (Cu) is used as the lower wiring and aluminum (Al) is adopted as the upper wiring in a multi-layer wiring stack, while a layer of diffusion barrier between the copper (Cu) and aluminum (Al) wirings is established to prevent metal diffusion between the upper and lower wirings. Generally, the layer of diffusion barrier can be a titanium (Ti) layer, a titanium nitride (TiN) layer, or a combined stack of Ti and TiN layers. Moreover, blending an aluminum (Al) alloy with copper (Cu) and silicon (Si) in is also useful in forming the conductors.

Once the configuration of conductors is determined, and the final layer of wiring is laid out, the patterning of openings on the bonding pad through which the wiring can bond the pad to the external chip package is prioritized. Hence, in some embodiments, a photoresist (PR) layer can be applied onto the conductive wiring to facilitate etching and thus the formation of openings on the bonding pads.

In various embodiments, to provide more capacity for data storage and faster data processing in an integrated circuit with a limited volume, increasing the density of integrated circuits is essential. The underlying wires of conductors are correspondingly more tightly aligned, which makes the spacing between two sections of conductors 200, referred to as a valley 300 in some embodiments, constantly narrowing.

Figure 2:
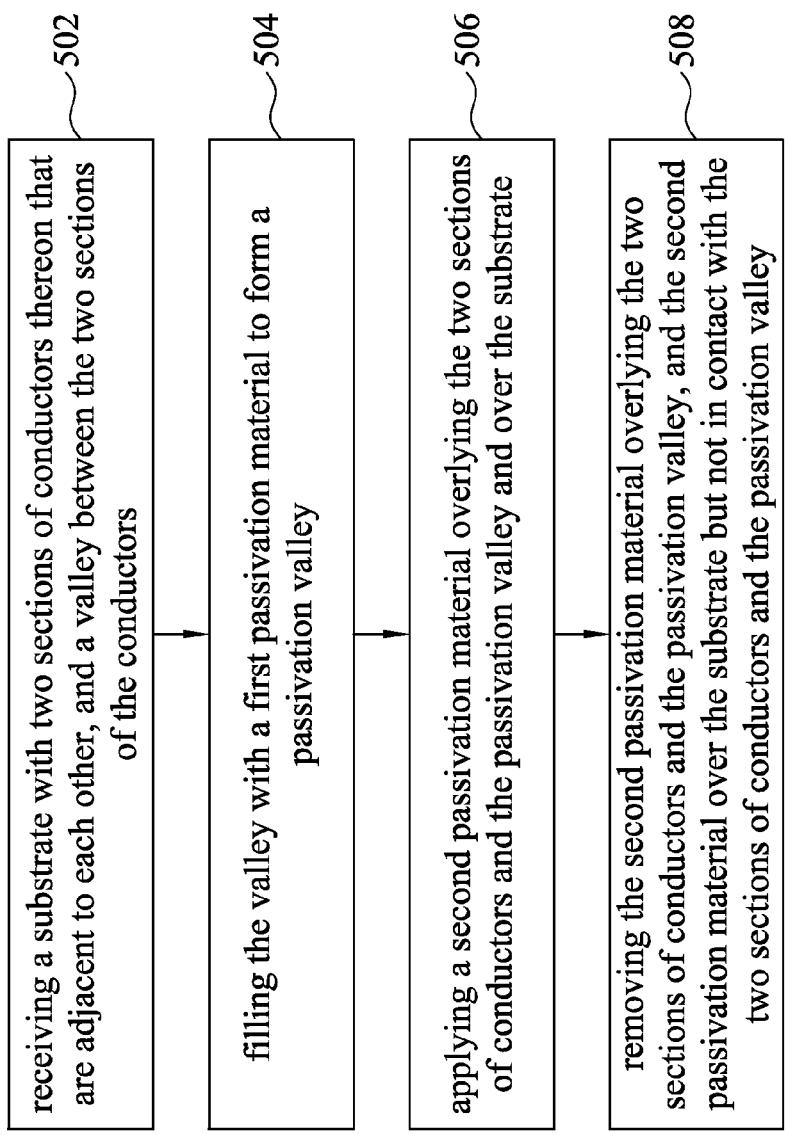
FIG. 2 is a process flow diagram of forming a semiconductor structure, in accordance with some embodiments.

Referring to FIG. 2, it elaborates a process flow diagram of forming a semiconductor structure, in accordance with some embodiments. In the process of forming a semiconductor structure, besides the wiring layout and the etch to form openings for wiring interconnections, delicate insulation between different layers of conductive wires to finely modulate the communication between integrated circuits, and protection of conductive wires against corrosion, is of huge importance as well. Therefore, a passivation material 400, also called the dielectric material, is applied onto the conductors and patterned beneath the photoresist in several embodiments.

In various embodiments, the overall process of forming the semiconductor structure is centered around the cycle of applying a passivation material 400 to offer insulation as well as protection to the conductors and etching to remove extra passivation materials 400 to reveal a top surface of the conductors 202 for interconnections.

To be more specific, the overall process of forming the semiconductor structure can be further divided into two phases. The first phase involves applying a first passivation material 410 over the semiconductor structure and etching away undesired portions of the first passivation material to expose a top surface of the two sections of conductors 202. The second phase involves applying a second passivation material 420 over the semiconductor structure and etching away undesired portions of the second passivation material to not only expose the a top surface of the two sections of conductors once more, but form a passivation sidewall block 426 for covering a side of the two sections of conductors and the passivation valley 204, thus preventing potential problems. In several embodiments, the two-phase etching procedure not only improves the etch selectivity, but provide more solid protection and functionality to the semiconductor structure.

In other words, after the procedure 502 of receiving the substrate 110 with two sections of conductors 200 thereon that are adjacent to each other, and the valley 300 between the two sections of the conductors, it is essential to carry out the procedure 504 of filling the valley 300 with the first passivation material 410 to form the passivation valley 412 while exposing the reveal a top surface of the conductors and the passivation valley 202. Filling the valley 300 with the first passivation material 410 is conducted by applying the first passivation material 410 over the two sections of conductors 200 and the valley 300 and etching the first passivation material overlying the two sections of conductors and the passivation valley 414.

Next, the procedure 506 of applying the second passivation material 420 overlying the two sections of conductors 200 and the passivation valley 412 is then performed in various embodiments. Following the applying the second passivation material 420 is the second etching process: the procedure 508 of removing the second passivation material overlying the two sections of conductors and the passivation valley 422, and the second passivation material over the substrate but not in contact with the two sections of conductors and the passivation valley 424. In some embodiments, it is this procedure 508 gives rise to the passivation sidewall block 426 by further etching away a portion of the second passivation material higher and in contact with the two sections of conductors and the passivation valley, also referred to as a second passivation material overlying the passivation sidewall block 428.

Figure 3A:
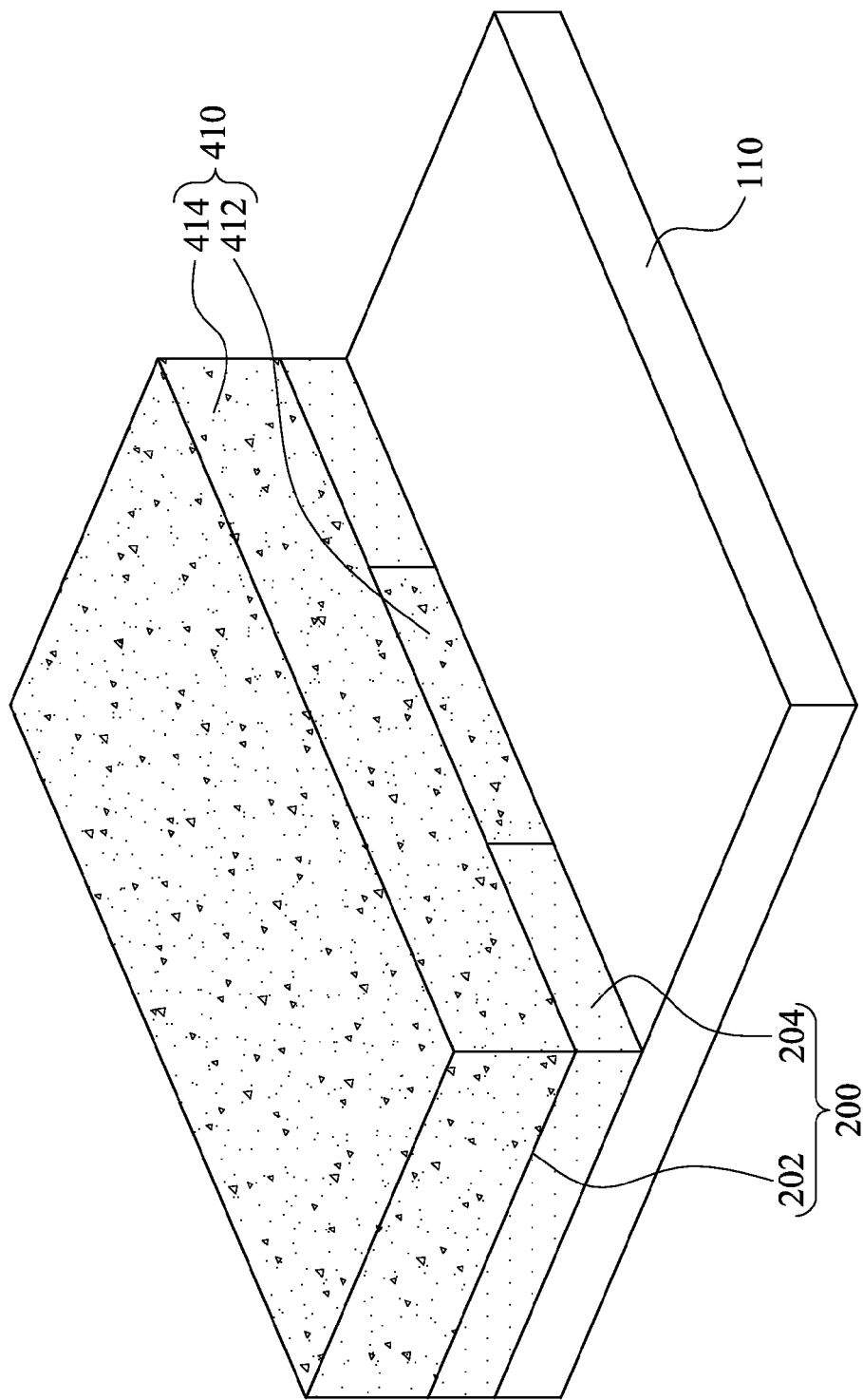
FIG. 3A through 3D are cross-sectional views at various stages of a method for forming a semiconductor structure in accordance with some embodiments.

Referring next to FIG. 3A, it illustrates a cross-sectional view of the first stage of forming a semiconductor structure in accordance with some embodiments. With high light-transmittance, water-resistance, and good reliability, the passivation layer 400 serves not only as an electric isolator to separate wirings of different level from one another, but also as a protective coating to shield the integrated circuit from moisture penetration, contamination, and scratches, and thus is applied onto the semiconductor structure.

In this process of applying a first passivation material 410, certain passivation substances can be employed. The passivation material can be either organic or inorganic. In some embodiments, the first passivation material 410 may be organic substances such as benzocyclobutene (BCB) and polyimide (PI), or inorganic substances such as undoped silicon glass (USG), tetraethyl orthosilicate (TEOS), phosphosilicate glass (PSG), silicon nitride (SiN), or silicon oxide ($SiO_2$).

The passivation material is deposited by the chemical vapor deposition (CVD), which is the microfabrication process of facilitating the volatile precursors to react with and adhere to a substrate surface to yield the preferable deposit. CVD can be operated in a variety of forms categorized according to different factors, such as the operating pressure, physical features of the vapor, and the plasma method.

In some embodiments, the atmospheric pressure CVD (APCVD) is performed at atmospheric pressure, while the low-pressure CVD (LPCVD) occurs at sub-atmospheric pressures to decrease undesired gas-phase reactions and enhance deposit uniformity across the substrate. In contrast to these, the ultrahigh vacuum CVD (UHVCVD) can operate at extremely low pressures, usually below $10^{-6}$ Pa (or $10^{-8}$ torr) to reduce side effects. In various embodiments, LPCVD or UHVCVD are most frequently adopted.

Meanwhile, chemical vapor deposition (CVD) can be categorized by plasma methods. In various embodiments, the plasma-enhanced CVD (PECVD) employs plasma to improve reaction rates of precursors, which allows deposition at lower temperatures. Due to the low operating temperatures, PECVD is quite useful in deposition of organic coatings such as silicon oxide ($SiO_2$) or plasma polymers, and thus is widely utilized in nanoparticle surface functionalization. In various embodiments, the remote plasma-enhanced CVD (RPECVD) removes the substrate from the plasma region to further drive the processing conditions down to the room temperature. Moreover, in some embodiments, the atomic-layer CVD (ALCVD) is adopted to deposit successive layers of distinct particles to produce a multi-layer crystalline film.

In various embodiments, the first passivation material 410 deposits on both the valley 300 and the top surface of the two sections of the conductors 202. The deposition of the first passivation material 410 on the valley 300 forms a passivation valley 412, while deposition of the first passivation material 410 on the top surface of the two sections of the conductors 202 forms a first passivation material overlying the two sections of conductors and the passivation valley 414.

In some embodiments, since an additional photo mask in close proximity to the edge of conductors is additionally applied to the bare substrate 110 beside the two sections of the conductors and the valley, no additional first passivation material 410 on the bare substrate 110 or a sidewall along the side of the two sections of conductors and the passivation valley 204 can be formed.

Figure 3B:
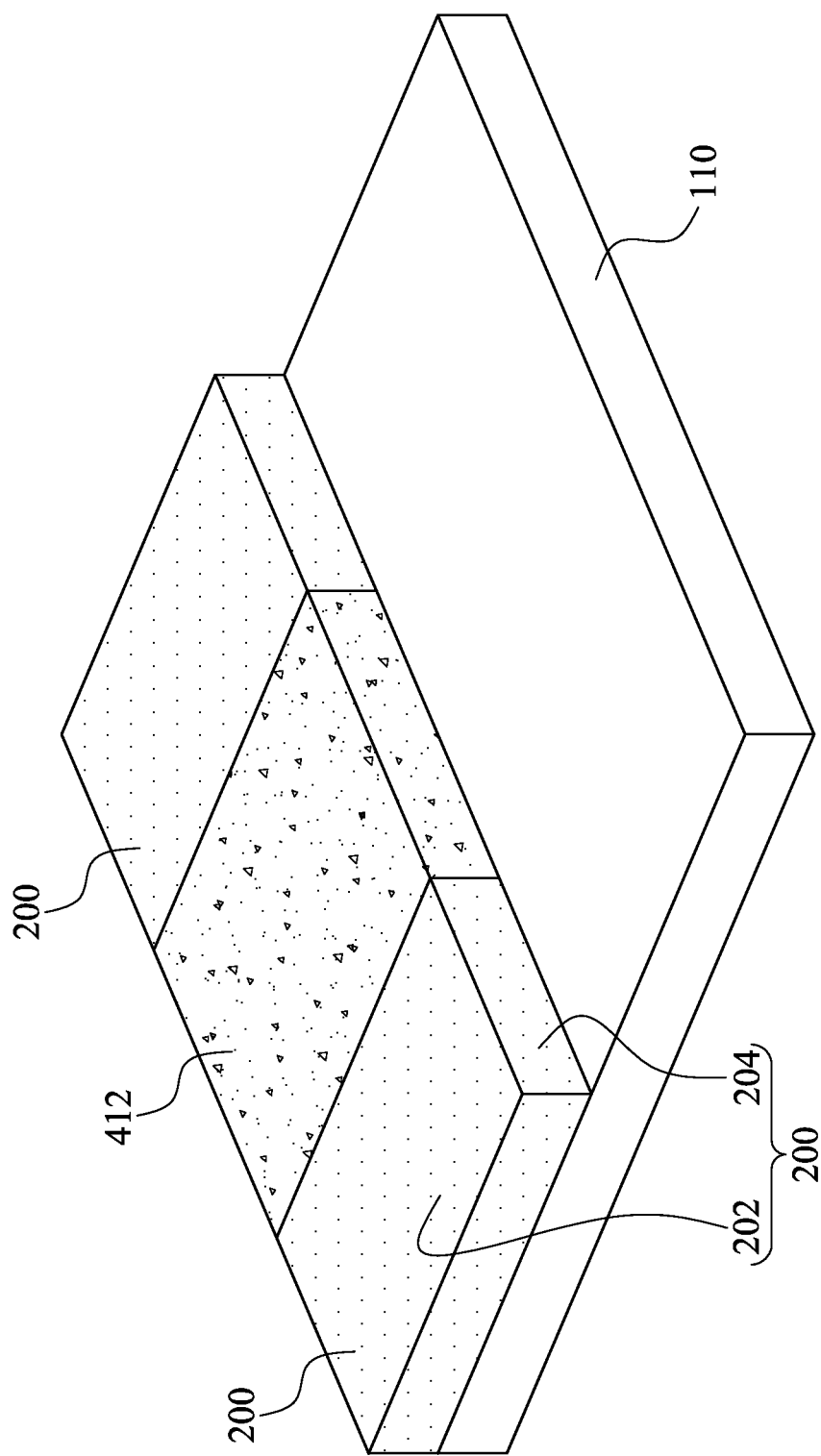

Referring next to FIG. 3B, it illustrates a cross-sectional view of the second stage of forming a semiconductor structure in accordance with some embodiments. After applying the first passivation material 410 over the semiconductor structure 100, the etching to remove undesirable portions of the first passivation material is necessary.

Etching methods of material includes the wet etching and dry etching. While the wet etching employs liquids or chemical solvents as the etchants, the dry etching employs ionic, gaseous etchants to etch the material in a more controllable, directional, and anisotropic way. Hence, the dry etching, also referred to as dry blanket etching in some embodiments, is generally operated in the etching of the passivation layer 400.

The dry blanket etching includes the reactive ion etching (RIE) and the high-density plasma (HDP) etching, which varies in certain aspects. In various embodiments, the reactive ion etching (RIE) is performed by exposing a surface to a bombardment of ions including fluorocarbons, oxygen, chlorine, or boron trichloride, which can be coupled with additional nitrogen, argon, or helium, to remove portions of the material from the exposed surface under a single radio frequency (RF) source.

In some embodiments, the high-density plasma (HDP) etching utilizes separate radio frequency (RF) sources, which separates the plasma power from the ion accelerating field. The high-density plasma (HDP) etching enables high-density plasma to be attained at low pressures, which improves directional etching, decreases the substrate damage, and keep up the compatible etching rate.

In an aim to expose the top surface of the two sections of conductors and the passivation valley 202, HDP or RIE is adopted as the first etching, which is operated to remove the first passivation material overlying the two sections of conductors 414 and reveal the top surface of the two sections of conductors and the passivation valley 202. In this way, the etching meets the purpose of filling the valley 300 to form the passivation valley 412 to facilitate insulation between the two sections of the conductors 200.

Figure 3C:
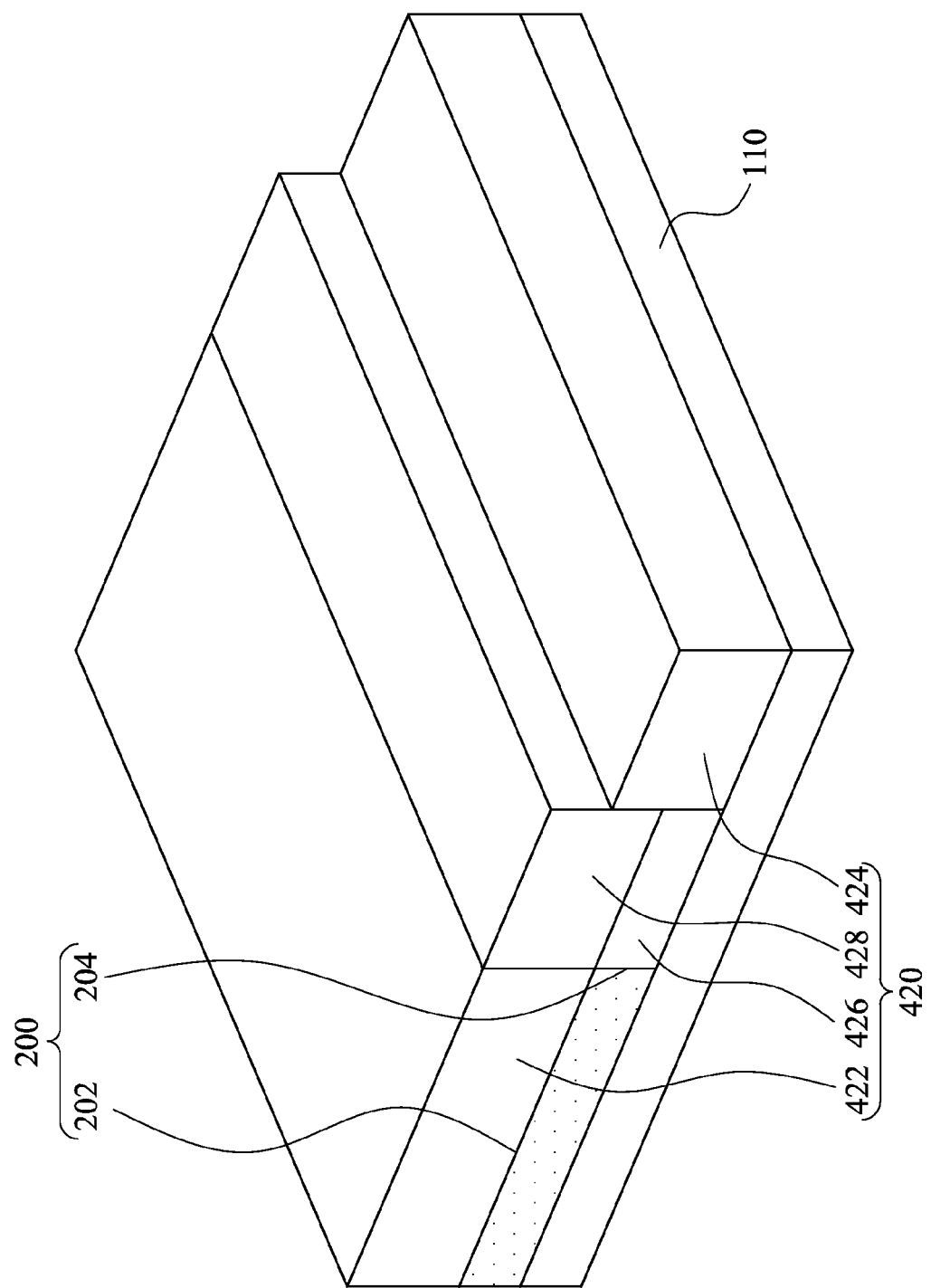

Turning to FIG. 3C, it illustrates a cross-sectional view of the third stage of forming a semiconductor structure in accordance with some embodiments. After etching certain portions of the first passivation material 410, applying a second passivation material is necessary to further protect a side of the two sections of conductors and the passivation valley 204 facing the bare substrate.

In this process of applying a second passivation material 420, certain passivation substances can be employed. In some embodiments, the material can be organic substances such as benzocyclobutene (BCB) and polyimide (PI), or inorganic substances such as undoped silicon glass (USG), tetraethyl orthosilicate (TEOS), phosphosilicate glass (PSG), silicon nitride (SiN), or silicon oxide ($SiO_2$). To put it differently, the first and the second passivation material can be identical or distinct substances.

The second passivation material is deposited by the chemical vapor deposition (CVD) in some embodiments, more preferably the PECVD. In some embodiments, the surface of the semiconductor structure can be categorized into a plurality of higher regions and lower regions. The higher region contains the two sections of the conductors 200 and the passivation valley 412, while the lower region contains only bare substrates. The difference in topography across the semiconductor structure leads to difference in the level of deposited second passivation material.

According to the topography of the semiconductor structure, the second passivation material deposited on different structures can vary in height. Due to the even deposition of materials in the chemical vapor deposition (CVD), the second passivation material overlying the two sections of conductors and the passivation valley 422 is as high as the second passivation material over the substrate but not in contact with the two sections of conductors and the passivation valley 424.

However, on the edge of the topography gap, namely the region of substrate in contact with the two sections of conductors and the passivation valley, the second passivation material tends to form a thin layer to fully envelope the side of the two sections of conductors and the passivation valley 204 facing the substrate. Thus, the height of the second passivation material over the substrate in contact with the two sections of conductors and the passivation valley is the summed height of both the second passivation material overlying the two sections of conductors and the passivation valley 422 and the two sections of conductors 200.

Figure 3D:
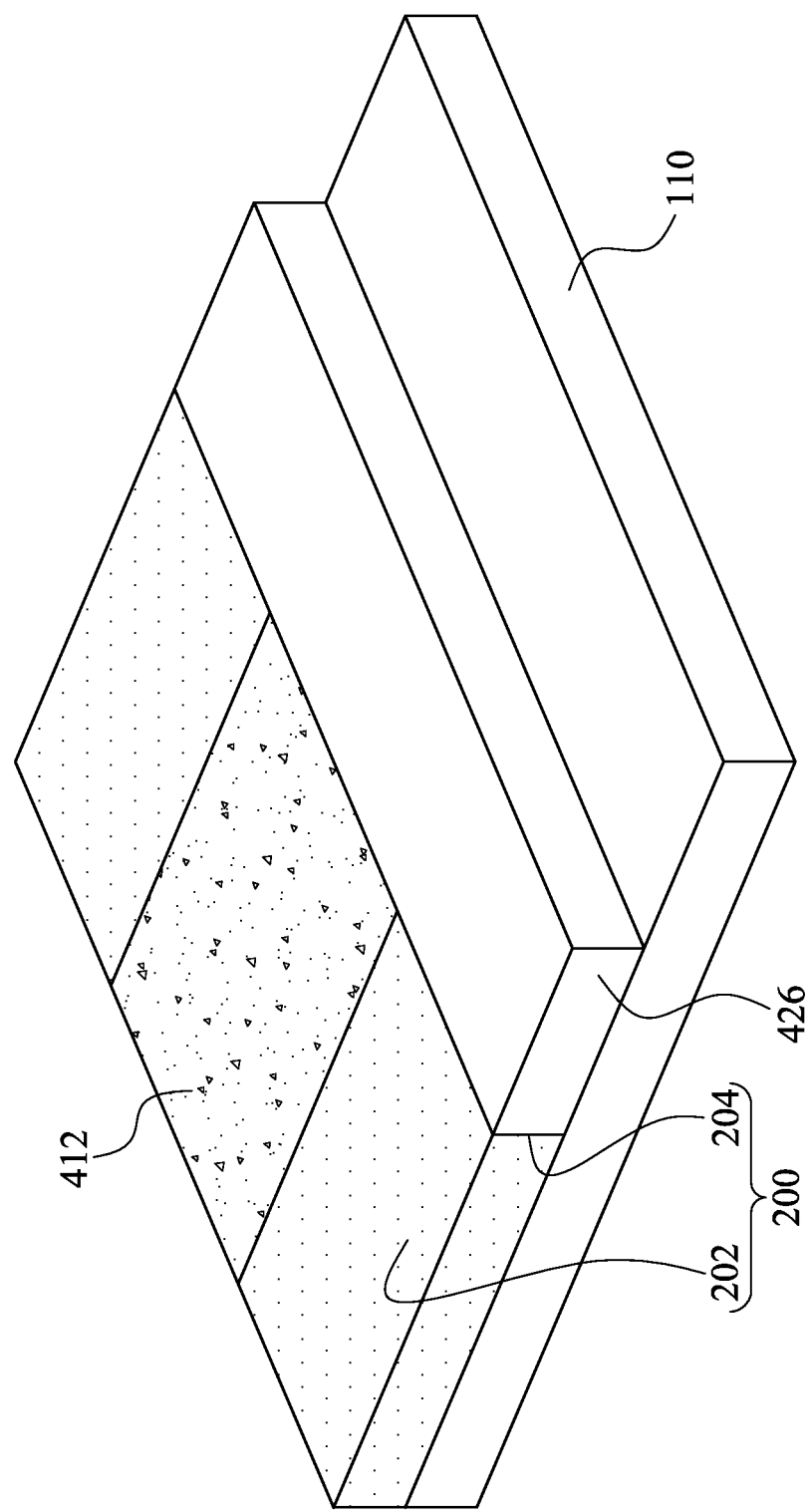

Referring next to FIG. 3D, following the applying of the second passivation material is the process of the second etching. In some embodiments, second etching can not only adopts distinct combinations of etchants, but etches the second passivation material isotropically with increased selectivity. The etchants of the blanket dry etch degrades the second passivation material evenly from the top, thus removing levels of the same height within a given period of time.

In various embodiments, since the second passivation material overlying the two sections of conductors and the passivation valley 422 is as high as the second passivation material over the substrate but not in contact with the two sections of conductors and the passivation valley 424, the two portions of the second passivation material will be gradually removed at the same rate. In terms of the higher second passivation material over the substrate in contact with the two sections of conductors and the passivation valley, since the upper part of which is as high as the second passivation material overlying the two sections of conductors and the passivation valley 422, the upper part of the second passivation material over the substrate in contact with the two sections of conductors and the passivation valley is also etched at the same rate.

Thus, over a certain period of time, the second passivation material overlying the two sections of conductors and the passivation valley 422, the second passivation material over the substrate but not in contact with the two sections of conductors and the passivation valley 424, and the upper part of the second passivation material over the substrate in contact with the two sections of conductors and the passivation valley, referred to as the second passivation material overlying the passivation sidewall block 428, are all removed by etchants, leaving a passivation sidewall block 426 cover the side of the two sections of conductors and the passivation valley 204 facing the bare substrate. Without over-etching, the passivation sidewall block 426 can completely seal the side of the two sections of conductors and the passivation valley 204, preventing the exposure of the passivation valley 412 and further problems thereof. In various embodiments, the passivation sidewall block 426 and the passivation valley 412 form a T-shaped pattern.

Figure 4:
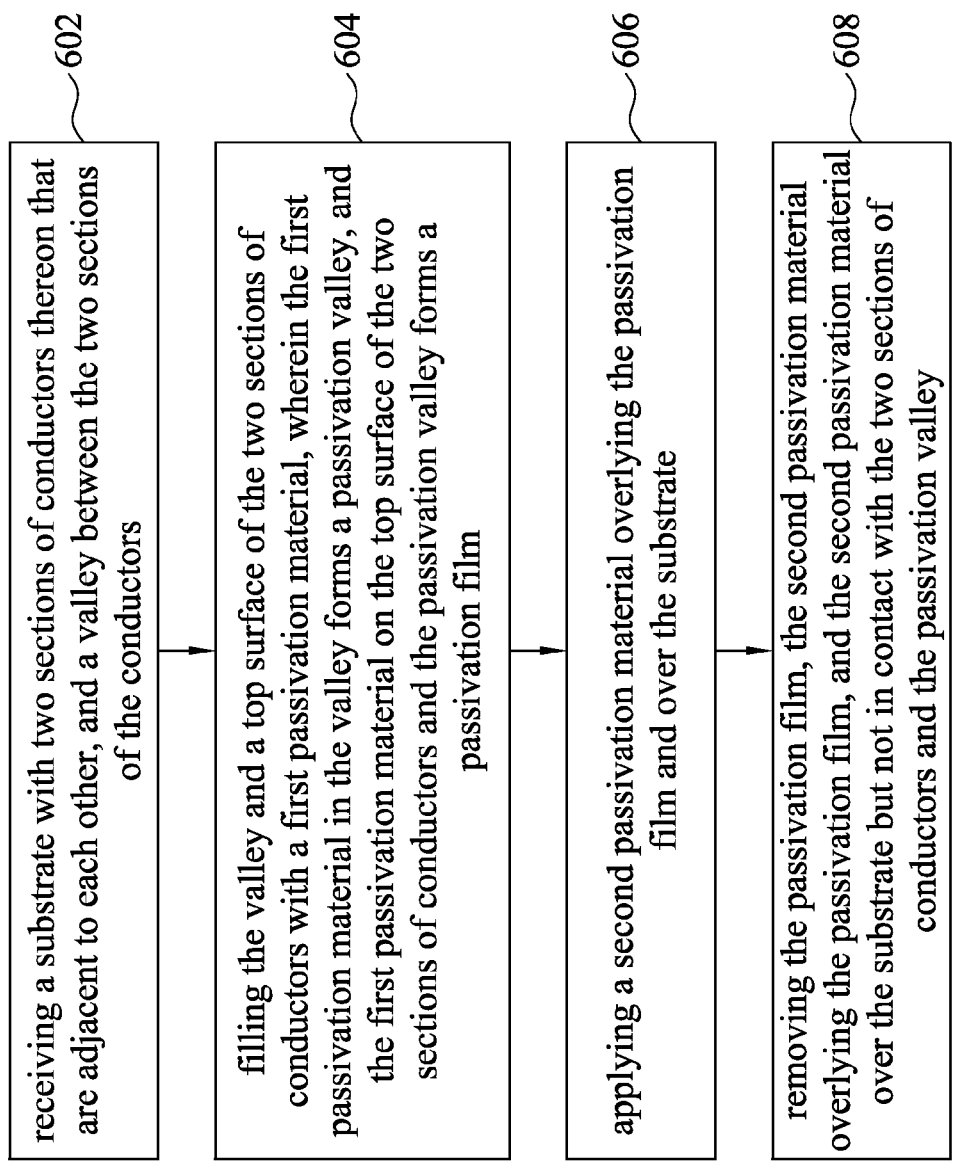
FIG. 4 is another process flow diagram of forming a semiconductor structure, in accordance with some embodiments.

Referring to FIG. 4, it elaborates another process flow diagram of forming a semiconductor structure 100, in accordance with some embodiments. In various embodiments, the overall process of forming the semiconductor structure involves applying the first a first passivation material 410, etching away undesired portions of the first passivation material partially, applying a second passivation material 420, and etching away undesired portions of the second passivation material to both expose the top surface of the two sections of conductors and the passivation valley 202 and form a passivation sidewall block 426 to avoid potential problems.

The difference of this process from the previously stated process lies in the extent of the first etching. In various embodiments, the first etching is designated to be incomplete, leaving a thin layer of the first passivation material on the top surface of the two sections of conductors and the passivation valley 202, thus forming a passivation film 415. Owing to the passivation film, the two sections of conductors 200 are not exposed, and the second passivation material is thus deposited on the passivation film. During the second etching, the passivation film 415 and other undesired portions of the second passivation material are removed, which reveals the top surface of the two sections of conductors and the passivation valley 202 and leaves the passivation sidewall block 426 covering the side of the two sections of conductors and the passivation valley 204 facing the bare substrate 110.

In the first place, the incomplete etching reduces the time of etching and prevents over-etch with a more well-calculated time period. In the second, due to the presence of the addition passivation film 415, the height of the second passivation material overlying the two sections of conductors and the passivation valley 422 can be lower, which reduces the deposition time and the amount of the second passivation material, saving a substantial amount of manufacturing costs.

In other words, after the procedure 602 of receiving the substrate 110 with two sections of conductors 200 thereon that are adjacent to each other and the valley 300 between the two sections of the conductors, it is crucial to perform the procedure 604 of filling the valley 300 and a top surface of the two sections of conductors 202 with a first passivation material 410.

In the subsequent first etching, the first passivation material over the top surface of the two sections of conductors and the passivation valley 414 is not completely removed. The outcome is that only the upper part of the first passivation material over the top surface of the two sections of conductors and the passivation valley, referred to as the first passivation material overlying the passivation film 416, is removed, leaving a passivation film 415 on the top surface of the two sections of conductors and the passivation valley 202.

Next, the procedure 606 of applying the second passivation material 420 overlying the passivation film 415 is then performed in various embodiments. Following the applying of the second passivation material 420 is the second etching process: the procedure 608 of removing the passivation film 415, the second passivation material overlying the passivation film 423, and the second passivation material over the substrate but not in contact with the two sections of conductors and the passivation valley 424. In some embodiments, it is this procedure 508 gives rise to the passivation sidewall block 426 by further etching away the second passivation material higher than the two sections of conductors and the passivation valley and along the side of the two sections of conductors and the passivation valley, also referred to as a second passivation material overlying the passivation sidewall block 428.

Figure 5A:
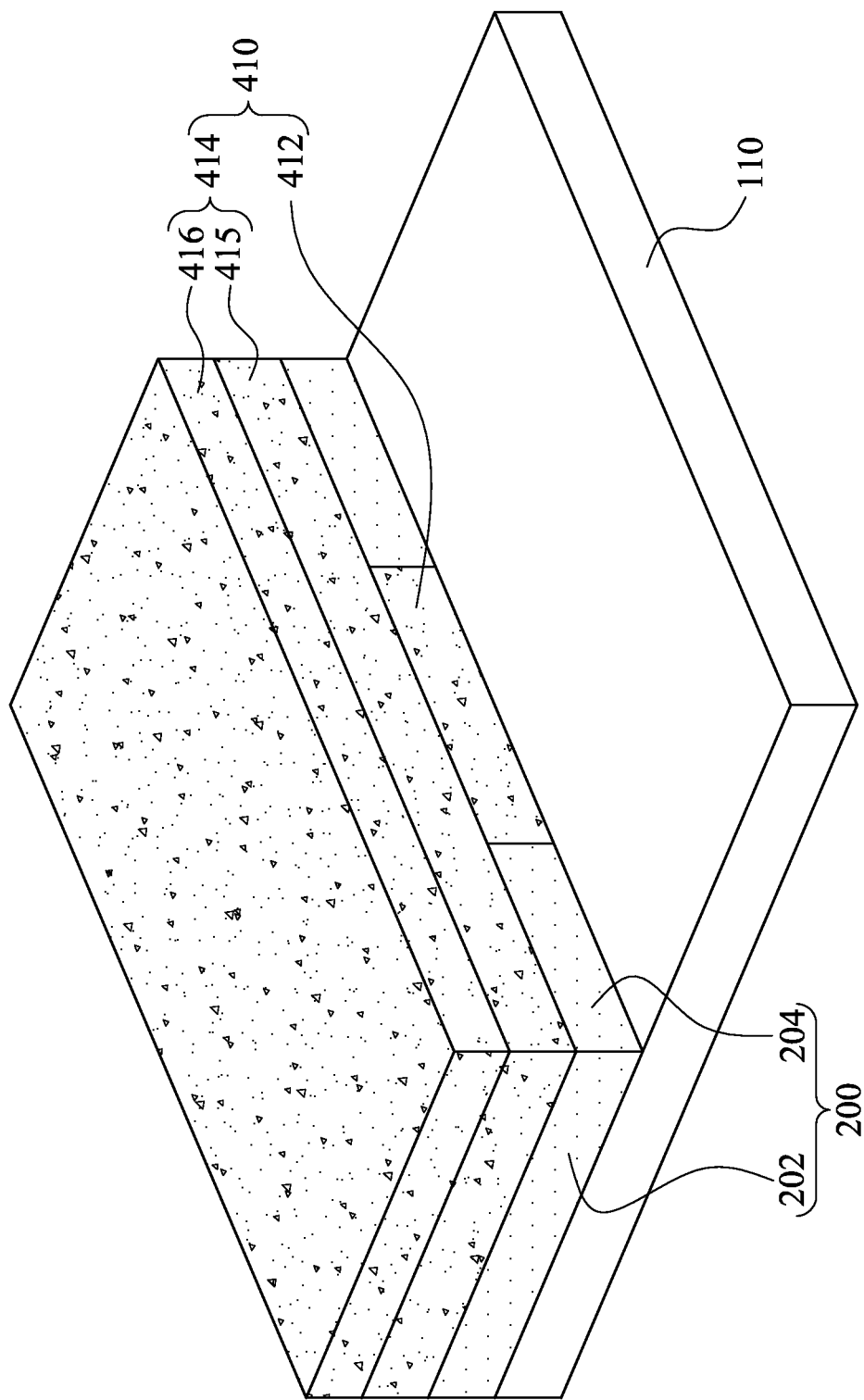
FIG. 5A through 5D are cross-sectional views at various stages of another method for forming a semiconductor structure in accordance with some embodiments.

Referring next to FIG. 5A, it illustrates a cross-sectional view of the first stage of another method for forming a semiconductor structure in accordance with some embodiments. In various embodiments, the first passivation material 410 is applied to the semiconductor structure 100 and deposits on both the valley 300 and the top surface of the two sections of the conductors 202. The deposition of the first passivation material 410 on the valley 300 forms a passivation valley 412, while deposition of the first passivation material 410 on the top surface of the two sections of the conductors 202 forms a first passivation material overlying the two sections of conductors 414.

In some embodiments, since an additional photo mask in close proximity to the edge of conductors is additionally applied to the bare substrate 110 beside the two sections of the conductors and the valley, no additional first passivation material 410 on the bare substrate 110 or a sidewall along the side of the two sections of conductors and the passivation valley 204 can be formed.

Figure 5B:
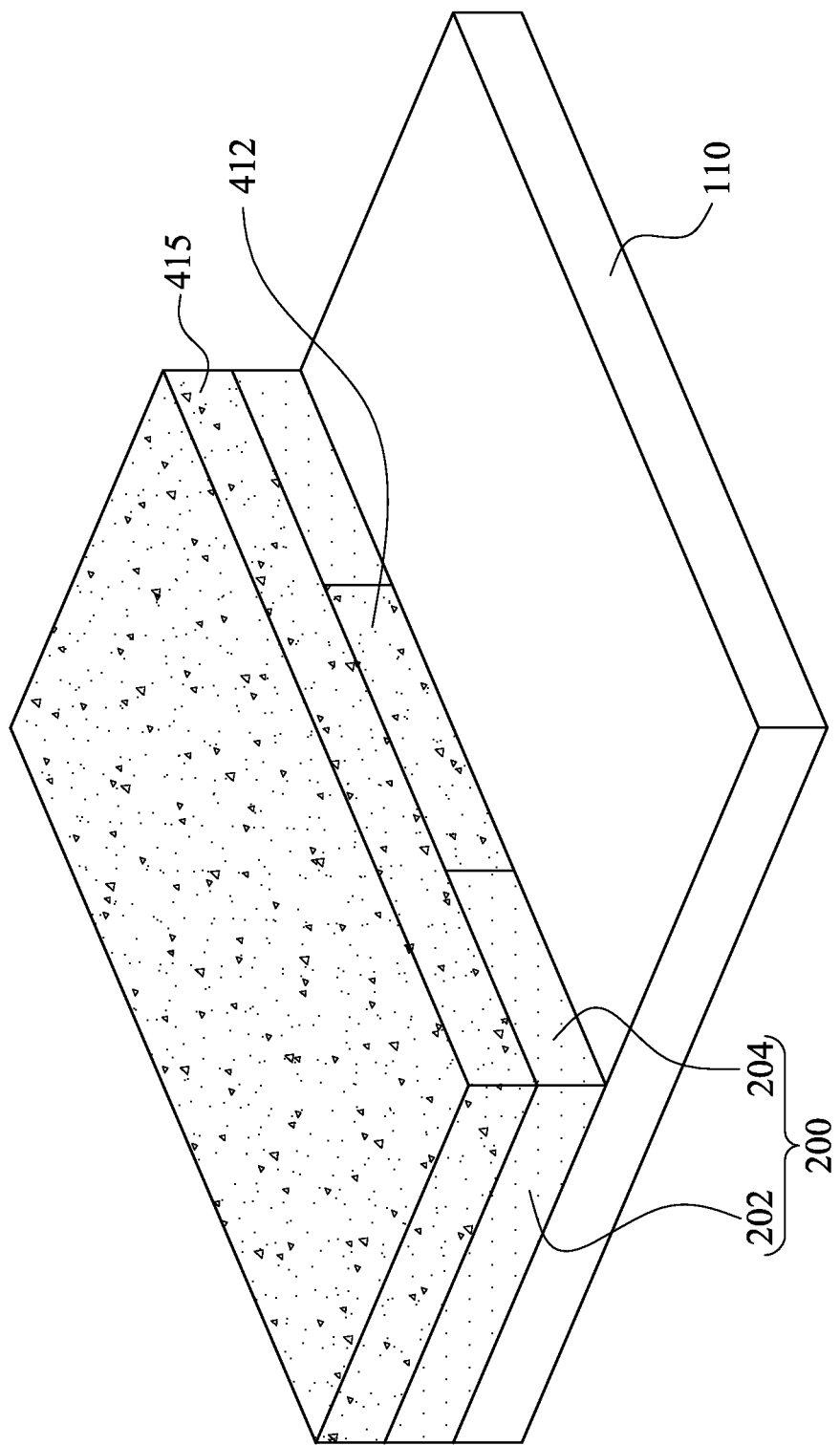

Referring next to FIG. 5B, it illustrates a cross-sectional view of a second stage of another method for forming a semiconductor structure in accordance with some embodiments. After applying the first passivation material over the semiconductor, the etching to remove undesirable portions of the first passivation material is subsequently performed.

It is in the first etching that highlights the distinction of this method. In some embodiments, the operating time of HDP etching or RIE to remove the first passivation material overlying the two sections of conductors 414 can be reduced, disabling the revelation of the top surface of the two sections of conductors and the passivation valley 202. Since no enough etching time is provided, the lower part of the first passivation material overlying the two sections of conductors and the passivation valley, designated as the passivation film 415 in some embodiments, is left intact. To put it differently, only the upper part of the first passivation material overlying the two sections of conductors and the passivation valley, designated as the first passivation material overlying the passivation film 416 in some embodiments, is removed. In this way, the method not only save the cost of etching, but prevents over etching of the passivation valley.

Figure 5C:
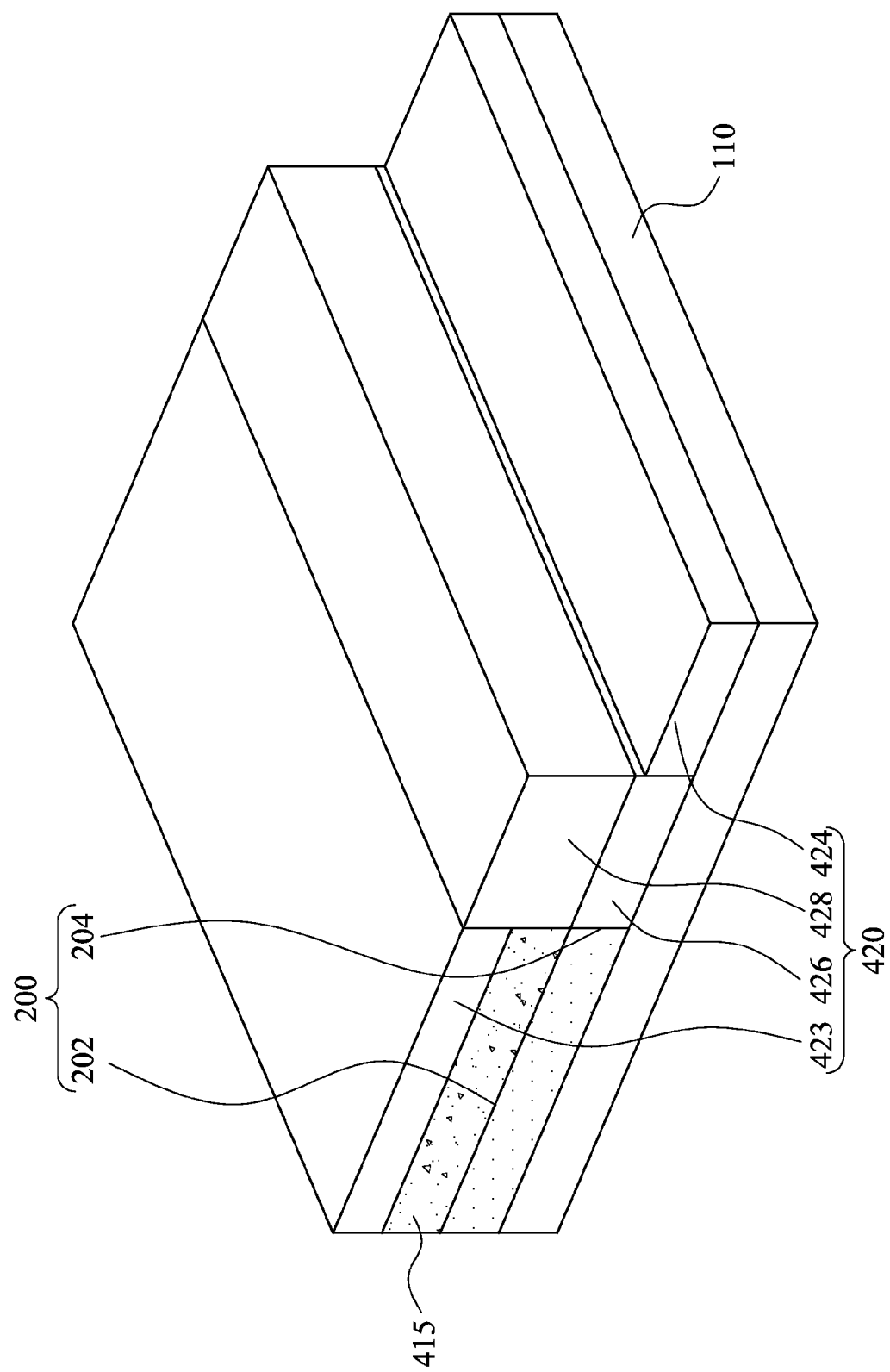

Turning to FIG. 5C, it illustrates a cross-sectional view of the third stage of another method for forming a semiconductor structure in accordance with some embodiments. After etching certain portions of the first passivation material 410, applying a second passivation material is necessary to further protect a side of the two sections of conductors and the passivation valley 204 facing the bare substrate.

In some embodiments, the second passivation material is deposited by CVD, and is affected by the difference in topography across the semiconductor structure. The second passivation material overlying the passivation film 423 is as high as the second passivation material over the substrate but not in contact with the two sections of conductors and the passivation valley 424, which can be rather thin due to the existing height of the passivation film 415. Nevertheless, at the conjunction of the topography gap, namely the substrate in contact with the two sections of conductors and the passivation valley, the second passivation material inclines to form a sidewall on the side of the two sections of conductors and the passivation valley 204 facing the substrate. Thus, the height of the second passivation material over the substrate in contact with the two sections of conductors and the passivation valley is the summed height of the passivation film 415, the second passivation material overlying the passivation film 423, and the two sections of conductors 200.

Figure 5D:
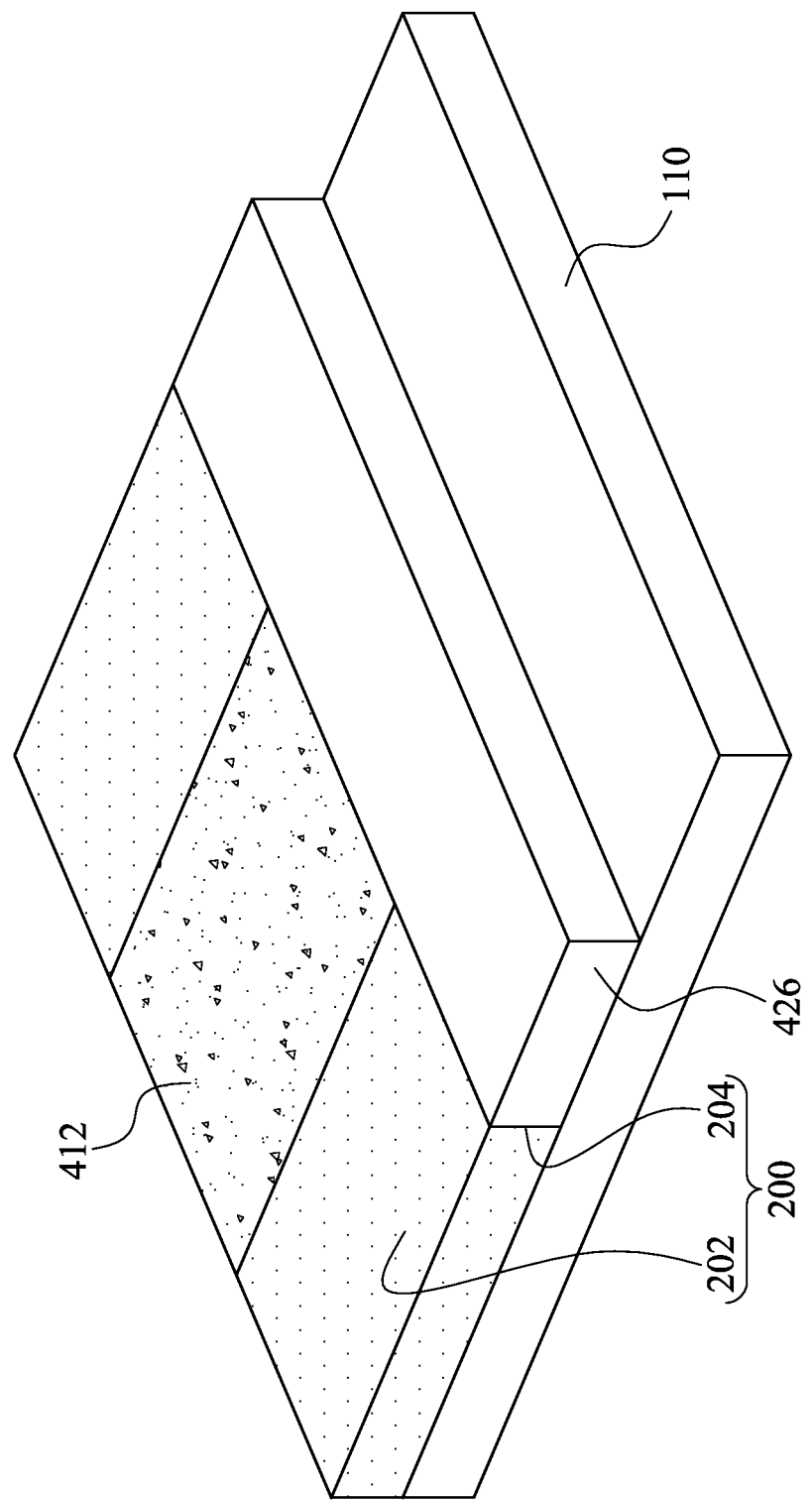

Referring next to FIG. 5D, following the deposition of the second passivation material is the process of the second etching to reveal the top surface of the two sections of conductors and the passivation valley 202. Since the second passivation material overlying the passivation film 423 is as high as the second passivation material over the substrate but not in contact with the two sections of conductors and the passivation valley 424 and an upper part of the second passivation material overlying the passivation sidewall block 428, these three portions of the second passivation material will be gradually removed at the same rate.

Also, since the lower part of the second passivation material overlying the passivation sidewall block 428 is as high as the passivation film 415, removal of these two portions is subsequently performed, exposing the top surface of the two sections of conductors and the passivation valley 202 while not exposing the side of the two sections of conductors and the passivation valley 204. In this way, the passivation sidewall block 426 is left to cover the side of the two sections of conductors and the passivation valley 204, preventing the exposure of the passivation valley 412 and further problems thereof. In various embodiments, the passivation sidewall block 426 and the passivation valley 412 form a T-shaped pattern.

In accordance with some embodiments, a method for fabricating a semiconductor structure 100 includes receiving a substrate 110 with two sections of conductors 200 thereon that are adjacent to each other, and a valley 300 between the two sections of the conductors 200 (502), filling the valley 300 with a first passivation material 410 to form a passivation valley 412 (504), applying a second passivation material 420 overlying the two sections of conductors 200 and the passivation valley 412 and over the substrate 110 (506), and removing the second passivation material overlying the two sections of conductors and the passivation valley 422, and the second passivation material over the substrate but not in contact with the two sections of conductors and the passivation valley 424 (508).

In accordance with some embodiments, another method for fabricating a semiconductor structure 100 includes receiving a substrate 110 with two sections of conductors 200 thereon that are adjacent to each other, and a valley 300 between the two sections of the conductors 200 (602), filling the valley 300 and a top surface of the two sections of conductors 202 with a first passivation material 410, wherein the first passivation material 410 in the valley 300 forms a passivation valley 412, and the first passivation material 410 on the top surface of the two sections of conductors and the passivation valley 202 forms a passivation film 415 (604), applying a second passivation material 420 overlying the passivation film 415 and over the substrate 110 (606), and removing the passivation film 415, the second passivation material overlying the passivation film 423, and the second passivation material over the substrate but not in contact with the two sections of conductors and the passivation valley 424 (608).

In accordance with some embodiments, a semiconductor structure includes a substrate 110 with two sections of conductors 200 thereon that are adjacent to each other, a valley 300 between the two sections of the conductors 200, and a passivation sidewall block 426 covering a side of the two sections of conductors and the valley 204.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for fabricating a semiconductor structure, the method comprising:
receiving a substrate with two sections of conductors thereon that are adjacent to each other, and a valley between the two sections of the conductors;
filling the valley with a first passivation material;
applying a second passivation material overlying the two sections of conductors and the first passivation material and over the substrate; and
removing a portion of the second passivation material to expose the two sections of conductors and the first passivation material and leaving a passivation sidewall block of the second passivation material on sidewalls of the two sections of conductors and the first passivation material.

2. The method of claim 1, wherein removing the portion of the second passivation material comprises etching the second passivation material overlying the two sections of conductors and the first passivation material to expose top surfaces of the two sections of conductors and the first passivation material.

3. The method of claim 1, wherein removing the portion of the second passivation material comprises etching the second passivation material overlying the two sections of conductors, the first passivation material, and the passivation sidewall block.

4. The method of claim 1, wherein removing the portion of the second passivation material comprises etching the second passivation material overlying the passivation sidewall block.

5. The method of claim 1, wherein a top surface of the passivation sidewall block and top surfaces of the two sections of conductors and the first passivation material are substantially coplanar.

6. The method of claim 1, wherein top surfaces of the two sections of conductors and the first passivation material are substantially coplanar.

7. The method of claim 1, wherein filling the valley with the first passivation material is conducted by applying the first passivation material overlying the two sections of conductors and in the valley, and etching a portion of the first passivation material overlying the two sections of conductors and exceeding the valley.

8. The method of claim 1, wherein the first passivation material or the second passivation material comprises a material made of undoped silicon glass (USG), tetraethyl orthosilicate (TEOS), phosphosilicate glass (PSG), silicon nitride (SiN), silicon dioxide ($SiO_2$), or benzocyclobutene (BCB).

9. The method of claim 1, wherein the two sections of conductors comprises a material made of aluminum, copper, or any combination thereof.

10. The method of claim 1, wherein the passivation sidewall block and the first passivation material form a T-shaped pattern.

11. The method of claim 1, wherein top surfaces of the two sections of conductors and a top surface of the first passivation material are substantially coplanar.

12. A method for fabricating a semiconductor structure, the method comprising:
receiving a substrate with two sections of conductors thereon that are adjacent to each other, and a valley between the two sections of the conductors;
forming a first passivation material in the valley and on top surfaces of the two sections of conductors, wherein the first passivation material has a first portion in the valley and a second portion on the top surfaces of the two sections of conductors and a top surface of the first portion of the first passivation material;
applying a second passivation material overlying the second portion of the first passivation material and over the substrate; and
removing the second portion of the first passivation material and a portion of the second passivation material to expose the two sections of conductors and the first portion of the first passivation material and leaving a passivation sidewall block of the second passivation material on sidewalls of the two sections of conductors and the first portion of the first passivation material.

13. The method of claim 12, wherein removing the second portion of the first passivation material and the portion of the second passivation material comprises etching the second portion of the first passivation material and the second passivation material overlying the first portion of the first passivation material to expose the top surfaces of the two sections of conductors and the first portion of the first passivation material.

14. The method of claim 12, wherein removing the portion of the second passivation material comprises etching the second passivation material overlying the second portion.

15. The method of claim 12, wherein removing the portion of the second passivation material comprises etching the second passivation material overlying the passivation sidewall block.

16. The method of claim 12, wherein a top surface of the passivation sidewall block and the top surfaces of the two sections of conductors and the first portion of the first passivation material are substantially coplanar.

17. The method of claim 12, wherein forming the first passivation material in the valley and on the top surfaces of the two sections of conductors comprises reducing a thickness of the first passivation material.

18. The method of claim 12, wherein the first passivation material or the second passivation material comprises a material made of undoped silicon glass (USG), tetraethyl orthosilicate (TEOS), phosphosilicate glass (PSG), silicon nitride (SiN), silicon dioxide ($SiO_2$), or benzocyclobutene (BCB).

19. The method of claim 12, wherein the two sections of conductors comprises a material made of aluminum, copper, or any combination thereof.

20. The method of claim 12, wherein the passivation sidewall block and the first portion of the first passivation material form a T-shaped pattern.

* * * * *